United States Patent
Kern et al.

[11] Patent Number: 5,820,289
[45] Date of Patent: Oct. 13, 1998

[54] CORNER JOINT ELEMENT

[75] Inventors: Klaus Kern; Hans-Martin Schwenk, both of Straubnhardt; Uwe Rieger, Karlsbad, all of Germany

[73] Assignee: Schroff GmbH, Straubenhardt, Germany

[21] Appl. No.: 694,097

[22] Filed: Aug. 8, 1996

[30]     Foreign Application Priority Data

Aug. 9, 1995 [DE] Germany .................. 195 29 270.7

[51] Int. Cl.⁶ .................................................. F16B 9/00
[52] U.S. Cl. .................... 403/231; 403/170; 403/217; 211/182; 312/265.4
[58] Field of Search ..................... 403/201, 170, 403/171, 176, 217, 218, 169, 219, 403, 382, 172, 350; 256/65; 312/265.1, 265.4, 223.1; 211/182, 189

[56]            References Cited

U.S. PATENT DOCUMENTS

| | | | |
|---|---|---|---|
| 3,255,721 | 6/1966 | Peterschmidt | 403/176 X |
| 3,272,582 | 9/1966 | Anderson et al. | 312/265.4 |
| 3,532,369 | 10/1970 | Reilly | 403/350 X |
| 3,603,628 | 9/1971 | Smith et al. | 403/217 X |
| 4,045,104 | 8/1977 | Peterson | 211/182 X |
| 4,072,432 | 2/1978 | Levy | 403/170 |
| 4,782,637 | 11/1988 | Eriksson et al. | 403/176 X |
| 5,003,741 | 4/1991 | Yeh | 312/265.1 X |
| 5,020,866 | 6/1991 | McIlwraith | 312/265.4 |
| 5,066,161 | 11/1991 | Pinney | 403/217 X |
| 5,228,762 | 7/1993 | Mascrier | 312/265.4 |
| 5,566,927 | 10/1996 | Venegas, Jr. | 256/65 X |

FOREIGN PATENT DOCUMENTS 439062  7/1991  European Pat. Off. ............... 403/172

*Primary Examiner*—Harry C. Kim
*Attorney, Agent, or Firm*—Merchant, Gould, Smith, Edell, Welter & Schmidt

[57]            ABSTRACT

A corner joint element 1 for longitudinal bars 7 and cross bars 8 that are created from hollow profiles 10 of a rack has three legs 2, 3 and 4, which are standing at right angles to each other. The surface of each leg 2, 3, 4 has at least one cavity 11. For the fastening of a hollow profile 10, slipped onto a leg 2, 3, 4, the wall area 12 of the hollow profile positioned above the cavity 11 is pushed into the cavity 11.

17 Claims, 1 Drawing Sheet

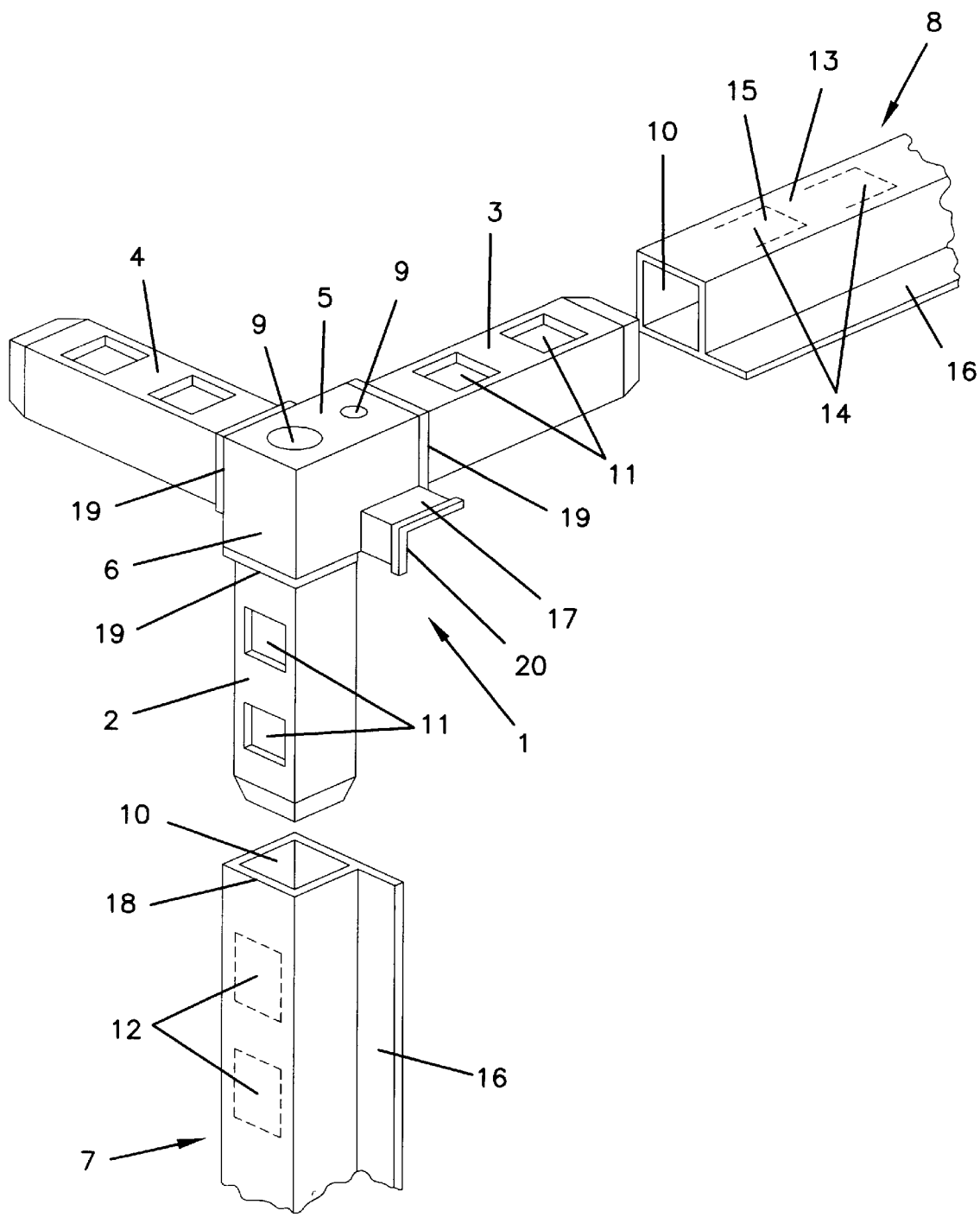

CORNER JOINT ELEMENT

DESCRIPTION

The invention pertains to a corner joint element for longitudinal bars and cross bars, made from hollow profiles, of a rack that can be assembled to equipment cabinets intended for the acceptance of electrical and electronic modules, with the following characteristics: the corner joint element has three legs, the three legs stand at right angles to each other, the hollow profiles can be slipped onto the legs, and the three legs fit exactly into the hollow profiles of the longitudinal bars and cross bars.

The invention finds application especially in equipment cabinets for industrial electronics, such as used for the acceptance of subassembly panels or pads, their wiring fields, the peripheral lead terminal, ventilation and cooling and the other accessories.

The four longitudinal bars and the eight cross bars that form a rack for equipment cabinets can be joined to each other in various ways. Known is the welding together of the profiled bars or supports made of steel or aluminum; also known is the connecting of them with the aid of bolts or screws. Furthermore, known are angular and U-shaped corner joints of sheet steel to which the longitudinal bars and cross bars of the rack that is to be assembled are screwed or bolted (Handbuch des 19" Aufbausystems, Dr. Dirk Hesse, Markt & Technik Verlag 1986, Page 120). For the creation of corner joints of the bars for a modular housing system, cubical corner junctions that engage with studs in guide slots of the bars, have holes and are frontally fastened to the bars, are also known (EP 0 389 910 A1).

Welded connections require time-consuming manufacturing, especially for finishing and painting, and for which the use of galvanized longitudinal bars and cross bars is possible only to a limited extent. Bolted connections require a relatively high assembly effort and, furthermore, must be especially protected against vibration strains.

Also known is a switch cabinet with a frame that is put together with hollow profile bars, which are connected to each other on the eight corners by three-legged corner brackets. These corner brackets are here inserted in the hollow profiles, which have undercut cavities for the acceptance of retention sections for the side walls. The connection between the hollow profiles and the corner brackets, both of which are made of plastic, occurs through snap-in projections on the legs that snap into holes in the hollow profile bars. However, sufficiently load-bearing connections for heavy switch cabinets can hardly be achieved in this way (DE 85 04 295 U1).

Another known cabinet has a rack of vertical and horizontal hollow profiles that at their contact points are set onto corner joints equipped with legs that contain longitudinal slots and do stand at right angles to each other. Leaf springs armored with claws sit in side cavities, and on sliding the hollow profiles on are pushed down and are then supposed to prevent the disengagement of the plug-in connection. The assembly of this rack is, however, cumbersome (U.S. Pat. No. 3,087,768).

Known is another cabinet for an electrical equipment unit with a framework that is connected with the aid of corner elements. This framework consists of standard profiles with a closed triangular cross section, and each corner element has three legs of triangular cross section for the slip-on of the ends of the profiles. Each leg contains a deep longitudinal slot that forms two webs, in one of which a bolt is provided in transverse direction. The bolt spreads on its tightening the webs apart, whereby a clamping of the profile sections is achieved from the inside out. However, the assembly of such a framework is time-consuming (DE 691 07 727 T2).

Finally, a three-legged connector for the construction of hollow pipe frame racks is known. The legs, which can be pushed into the hollow tubes or pipes are on their surface provided with especially formed troughs and channels for the acceptance of a spray adhesive, with the aid of which the bond between the connectors and the pipes is achieved. The preparation of the bonding points and the setting times of the adhesive is, however, time-consuming and requires waiting times (DE 29 11 330 A1).

The goal of the invention is the conception of a corner joint element for horizontal and vertical supports, made from hollow profiles, for a rack, with the aid of which the longitudinal bars and cross bars can be inextricably joined without bolts and welding in a simple, time-saving manner and with the creation of perfect electrical connections.

The stated goal is achieved with the use of a corner joint element that has 3 legs, where the three legs are standing at right angles to each other, the hollow profiles can be pushed onto these legs, the three legs do fit exactly into the hollow profiles of the longitudinal bars and cross bars, and the surface of each leg has at least one cavity, where for a durable electrical connection that can no longer be separated without destruction, and the mechanical mounting of a longitudinal bar or cross bar that is pushed with its hollow profile onto one of the legs, the wall area of the hollow profile that lies on top of the cavity is at least partially pushed into the cavity.

For the creation of a corner joint of two bars, which are positioned at right angles to each other, only two process steps are required, i.e. the sliding of the hollow profiles onto the legs and the pushing-in of the wall areas of the hollow profiles positioned above the cavities of the legs. The achieved connection resists the highest loads. An additional advantage of this is that not only durable electrical connections between the bars are achieved through the corner joint element, but also that the corrosion protection of the bar surface (galvanizing, anodizing, paint) is not detrimentally affected at any place.

For reasons of mechanical strength it is an advantage to have the three legs joined to each other by a connecting block. The connecting block is expediently an elbow onto which two legs are formed, and on the crest of which the third leg is fastened in a removable manner. The Corner joint element consists here of two parts, and the third leg is fastened by a bolt, which has the advantage that the rack can be transported disassembled in the form of two finished frames and four cross bars to be attached.

The elbow that forms the connecting block can be equipped with means of fastening for the bolting of a base to the rack and for attaching of covering parts.

The legs and the hollow profiles should expediently have matching rectangular cross sections.

The cavity of the legs can have a rectangular cross section.

In advantageous advanced development of the invention, the cavity will have the form of a truncated pyramid. This measure favors the flow of the material and prevents the generation of cracks in the wall area of the hollow profile on push-in.

The cavity can also be a cross slot or longitudinal slot formed in the leg, which expediently have a rectangular cross section. Such slots can be produced at low cost and the wall area of the hollow profile pressed into them has here an elongated rectangular shape.

In an alternative form of execution of the invention, the wall area of the hollow profile to be pushed in is a tongue, the free end of which, punched out of the wall of the hollow profile, is pressed into the cavity of the leg. In connection with a cavity in the shape of a low prism or a low truncated pyramid is achieved a very good seizing effect for an elastic material inserted between a stop edge on the corner joint element and the frontal edge of the hollow profile, and especially a high assurance against a loosening of the plug connection in longitudinal direction of the bars under the influence of very strong vibrations, if on depressing the tongue a certain longitudinal displacement of the hollow profile occurs against the corner joint element.

A longitudinal rail can be attached on the side of the hollow profiles, creating a knife edge in connection with sealing beads provided on covering parts or a door.

A corner angle piece that is formed onto the side of the elbow opposite of the third leg serves for the creation of a gap-less transition of the longitudinal rails past the corner joints.

In order to equalize mounting tolerances, the corner angle piece can be provided with a sealing bead of elastic materials over its free edges.

On equipment cabinets sealed off against outside influences it is advantageous to provide seals of elastic materials between the frontal edges of the hollow profiles and the connecting block constituting the elbow.

In the following, the invention is described in detail on hand of a preferred form of execution with reference to the attached sheet of drawing. The drawing depicts a corner joint element together with partial sections of a longitudinal bar and a cross bar in perspective.

The depicted corner joint element has three legs 2, 3 and 4, which stand at right angles to each other. These three legs 2, 3 and 4 are connected to each other by a connecting block 5. The connecting block 5 is a short elbow onto which two of the three legs 2 and 3 are formed. The third leg 4 is connected in a removable manner to the crest of the connecting block, e.g., by a fastening bolt (not shown) passing through the connecting block 5 and screwed into a threaded hole located in direction of the longitudinal axis of leg 4.

The corner joint element 1 is preferentially made of die cast aluminum. It serves for the creation of the eight corner connections of four longitudinal bars 7 (of which one is shown in the drawing in broken-off form) and eight cross bars 8, from which a rack for the acceptance of electrical and electronic module and subracks is assembled. Such a rack is equipped internally with additional longitudinal and cross supports and also bottoms, and its outer sides are provided with covering for the top and the walls, and also with a bottom. At least one of the four sides can be provided with a pivoting door that is fitted to the rack. The elbow forming the connecting block 5 has means of fastenings 9, for example through-holes and/or threaded holes provided for the fastening of the bottom or the bolting of the walls, the door and a base.

The longitudinal bars 7 and cross bars 8 are essentially constructed from hollow profiles 10, which are made of galvanized sheet steel. These hollow profiles 10 can be slipped onto the legs 2, 3 and 4; the three legs 2, 3, and 4 fit with little play exactly into the hollow profiles 10 of the longitudinal bars 7 or the cross bars 8. The legs 2, 3, 4 and the hollow profiles 10 have a rectangular cross section; this cross section is square in the depicted form of execution. The chosen cross section shape could also be circular. Furthermore, the three legs 2, 3, 4 can have a U-shaped cross section, and the longitudinal bars 7 or cross bars 8 can have a corresponding U-profile, the sides of which are U-shaped and grip around the sides of the cross sections of the longitudinal bars 7 and cross bars 8.

The surface of each of the three legs 2, 3 and 4 has two cavities 11. These cavities 11 have a rectangular or square horizontal projection and the shape of a very low truncated pyramid. Also conceivable are cavities in the form of a cross slot (not depicted) or a longitudinal slot (also not depicted).

For the no longer detachable fastening of a longitudinal bar 7 or a cross bar 8 that is slipped with its hollow profile onto a leg 2, 3 and 4 until it abuts the connecting block 5, the wall area 12 (indicated by dotted lines) of the corresponding hollow profile 10 that is then situated above the cavity or cavities 11 is at least partially pushed into the cavity 11 located below it. This occurs with a suitable hand-operated or machine-operated tool equipped with an impact die (not depicted). This results in a shaping of the hollow profile 10 in the wall area 12 and its near vicinity, and a rigid, play-free and electrically conducting connection between the Corner joint element and the respective longitudinal bar 7 or the cross bar 8 that can only be separated with destruction of the involved structural elements.

It lies within the boundaries of the invention if the wall area 12 that is to be pushed in is a tongue 14 consisting of the wall 13 of the hollow profile 10, the free end 15 of which that is punched out of the wall 12 is pushed into the cavity 11 of the leg 2, 3, or 4. The tongue 14 can here have a rectangular, triangular, or also a circular horizontal projection, which then may correspondingly be matched by the horizontal projection of the cavity 11.

Attached to the hollow profile 10 of the longitudinal bars 7 and cross bars 8 is a longitudinal rail 16 that lies in the same plane with one of the four sides of the hollow profile 10. A corner angle piece 17 in the shape of a gable roof that is formed onto the connecting block 5 (the corner elbow) extends sideways and is situated on the side opposite the leg 4. With the hollow profiles 10 slipped on, their longitudinal rails 16 align with the opposing sections of the corner angle piece 17 and thereby do form a continuous knife edge, which in equipment housings that are sealed against external influences are situated opposite an elastic sealing bead fastened to a covering or the door.

Provided between the frontal edges 18 of the hollow profiles 10 and the offsets of the elbow formed by the connecting block 5 are seals 19 of a rubber-elastic material that create a smooth transition between the connecting block 5 and the hollow profiles 10.

The corner angel piece 17 projecting from the connecting block 5 carries on its free edges a sealing bead 20 of elastic material with a U-shaped cross section, to assure the gap-less transition between the longitudinal rail 16 of the hollow profile 10 of a longitudinal bar 7 over the corner angel piece 17 to the hollow profile 17 of the abutting cross bar 8.

What is claimed is:

1. A corner joint device having a unitary corner joint element and longitudinal bars and cross bars that are made from hollow profiles, of a rack for equipment cabinets intended for the acceptance of electrical modules, the device comprising:

the corner joint element (1) having three legs (2, 3, 4), connected to each other by a connecting block (5), wherein the connecting block (5) is an elbow extending into two of the three legs (2 and 3) and one of the three legs (4) is attached to its crest (6) in a removable manner, the three legs (2, 3, 4) standing at right angles to each other, wherein the hollow profiles have a wall area (10) and are configured for slipping onto the legs (2, 3, 4), wherein the three legs (2, 3, 4) fit exactly into the hollow profiles (10) of the longitudinal bars (7) and the cross bars (8), wherein the surface of each leg (2, 3, 4) has at least one cavity (11), and for a permanent electrical connection, unbreakable without destruction, and for mechanical attachment of longitudinal bars (7) or cross bars (8), slipped with its hollow profile (10) onto one of the legs (2, 3, 4), the wall area (12) of the hollow profile (10) situated above the cavity (1) of the leg (2, 3 or 4) of the hollow profile is at least partially pushed into the cavity (1).

2. The corner joint device according to claim 1, wherein the elbow forming the connecting block (5) is equipped with means of fastening (9).

3. The corner joint device according to claim 2, wherein a corner angle piece (17) having free edges is shaped onto the side of the elbow that is opposite one of the three legs (4).

4. The corner joint device according to claim 3, wherein the free edges of the corner angle piece (17) are covered with a sealing bead (20).

5. The corner joint device according to claim 1, wherein the legs (2, 3, 4) and the hollow profiles (10) have matching rectangular cross sections.

6. The corner joint device according to claim 1, wherein the cavity (11) has a rectangular horizontal projection.

7. The corner joint device according to claim 1, wherein the cavity has the shape of a low truncated pyramid.

8. The corner joint device according to claim 1, wherein the wall area (12) of the hollow profile (10) is a tongue (14) having a free end (15) punched out of the wall (13) of the hollow profile (10) and pushed into the cavity (11) of the leg (2, 3, 4).

9. The corner joint device according to claim 1, further comprising a longitudinal rail (16) attached to the hollow profile.

10. The corner joint element according to claim 1, the hollow profiles (10) having frontal edges, wherein seals (19) between frontal edges (18) of the hollow profiles (10) and the connecting block (5) form the elbow.

11. A corner joint device having a unitary corner joint element and bars of a rack for equipment cabinets, the corner joint element connecting the bars, the bars having hollow rectangular profiles and longitudinal rails, the corner joint device comprising:

the corner joint element having three legs with rectangular profiles and tapered ends extending at right angles to each other, wherein a surface of each leg includes at least two aligned cavities formed therein, wherein one of the three legs is removably connected to the corner joint element;

a sealing bead affixed to the corner joint element for engaging ends of the bars;

a corner angle piece having a angle sealing bead forming a continuous surface with the longitudinal rails when the sealing bead engages ends of the bars;

wherein the hollow profiles are configured for slipping onto the three legs so that the three legs fit into the hollow profiles of the bars thereby forming an electrically conductive connection; and wherein wall areas of the hollow profiles situated above the cavities of the legs associated with the hollow profile are at least partially pushed into the cavities.

12. A conductive electrical equipment rack, comprising:

a unitary connecting block having three legs extending at right angles to each other, wherein a surface of each leg includes at least one cavity formed therein;

bars having hollow profiles;

a sealing bead affixed to the connecting block for engaging ends of the bars;

wherein the hollow profiles are configured for slipping onto the three legs so that the three legs fit into the hollow profiles of the bars forming an electrically conductive connection;

wherein a wall area of the hollow profile situated above the cavity of one of the legs associated with the hollow profile is at least partially pushed into the cavity; and wherein one of the three legs is removably connected to the connecting block.

13. The rack of claim 12, wherein the legs have a rectangular profile.

14. The rack of claim 12, wherein the surface of each leg defines a plurality of aligned cavities.

15. The rack of claim 12, wherein each of the three legs has a tapered end for inserting into the hollow profiles of the bars.

16. A conductive electrical equipment rack, comprising:

a unitary connecting block having three legs extending at right angles to each other, wherein a surface of each leg includes at least one cavity formed therein;

bars having hollow profiles;

a sealing bead affixed to the connecting block for engaging ends of the bars;

wherein the hollow profiles are configured for slipping onto the three legs so that the three legs fit into the hollow profiles of the bars forming an electrically conductive connection;

wherein a wall area of the hollow profile situated above the cavity of one of the legs associated with the hollow profile is at least partially pushed into the cavity;

wherein the hollow profiles further comprise a longitudinal rail and the connecting block further comprises a corner angle piece, wherein the longitudinal rail and the corner angle piece are configured to form a continuous surface when the sealing bead engages the ends of the bars.

17. The rack of claim 16, wherein the corner angle piece comprises an angle sealing bead affixed to the corner angle piece for engaging the end of the longitudinal rail.

* * * * *